United States Patent [19]

Mruzek

[11] Patent Number: 5,522,226
[45] Date of Patent: Jun. 4, 1996

[54] POSITIVE RETRACTION MECHANISM FOR CRYOGENIC THERMAL JOINTS

[75] Inventor: Michael T. Mruzek, East Troy, Wis.

[73] Assignee: General Electric Company, Milwaukee, Wis.

[21] Appl. No.: 527,123

[22] Filed: Sep. 12, 1995

[51] Int. Cl.[6] ................................................. F25B 19/00
[52] U.S. Cl. ............................. 62/51.1; 62/383; 165/185
[58] Field of Search ...................... 62/51.1, 383; 165/185

[56] References Cited

U.S. PATENT DOCUMENTS

| | | | |
|---|---|---|---|
| 4,944,155 | 7/1990 | Alexander | 62/51.1 |
| 5,216,889 | 6/1993 | Herd et al. | 62/51.1 |
| 5,222,366 | 6/1993 | Herd et al. | 62/51.1 |
| 5,247,800 | 9/1993 | Mruzek et al. | 62/383 |
| 5,446,433 | 8/1995 | Laskaris et al. | 62/51.1 |

*Primary Examiner*—Ronald C. Capossela
*Attorney, Agent, or Firm*—Irving M. Freedman; John H. Pilarski

[57] ABSTRACT

A positive retraction mechanism for cryogenic thermal joints including deformable interfaces to separate joints which have cold welded utilizing a moveable enclosing sleeve and an actuating mechanism including the force of a compressed bellows to move a retraction flange into engagement with retraction rods which force the thermal joint apart through controlled movement of the retraction flange.

19 Claims, 3 Drawing Sheets

FIG_1

FIG._2

POSITIVE RETRACTION MECHANISM FOR CRYOGENIC THERMAL JOINTS

BACKGROUND OF INVENTION

This invention relates to a superconducting magnet assembly for a magnetic resonance imaging system (hereinafter called "MRI"), and more particularly to an improved and simplified positive retraction assembly for cryogenic thermal joints useful in MRI magnets.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil (for a period, for example, of only ten minutes) to introduce a current flow through the coils, the current will continue to flow through the coils even alter power is removed due to the absence of electrical resistance at the superconducting temperature, thereby maintaining a strong magnetic field. Superconducting magnets find wide application in the field of MRI.

Liquid helium has been used to provide the cryogenic temperatures necessary for superconducting magnet operation and is satisfactory for MRI operation. However, helium is commercially obtained only in a few locations, and the provision of a steady supply of liquid helium to MRI installations all over the world has proved to be difficult and costly. This has led to considerable effort being directed at superconducting magnet structures which can be rendered and maintained in superconducting operation with a minimized requirement to continually replace boiled-off helium. Considerable research and development effort has also been directed at the use of mechanical cryocoolers to provide conduction cooling in place of liquid helium cryogen cooling. However, the cooling capability of current cryocoolers is not as great in magnitude of cooling, or in the cooling temperature obtainable, as compared with liquid helium cooling. This increases the need for good thermal insulation and prevention of thermal leakage in such superconducting magnets.

This has in turn led to the continuing need for improved thermal joints to prevent thermal resistance when securing devices together in a superconducting magnet. U.S. Pat. No. 5,247,800, of Michael T. Mruzek, Phillip Eckels and Clyde Gouldsberry, issued Sep. 28, 1993, and assigned to the same assignee as the subject invention discloses the use of soft indium material such as on one member in contact with a raised pattern (such as a knurl or spiral pattern) on the other of the members to be joined. The raised pattern penetrates the soft indium and establishes very good thermal contact between the joined members such as the joining of a cryocooler to the magnet assembly. In fact, the contact is so good that the joints have a tendency to stick or "cold weld" over a period of time such that it becomes extremely difficult to later separate the devices when necessary for repair, replacement or servicing.

It is known to utilize a bellows in combination with such thermal joints. The bellows is compressed during assembly and uniting of the devices. It later transmits a separation force when the fasteners uniting the devices are loosened. However, the bellows force is not reliable in breaking thermal joints which have been in place for a period of time because of the aforementioned sticking or cold welding; the thinwalled bellows being incapable of transmitting substantial force.

Accordingly, there exists a need for an improved mechanism to provide positive retraction for separation of such thermal joints, preferably a mechanism which can supplement the bellows force. However, it is also important that any retraction mechanism minimizes heat leakage which results from connecting devices having portions at different temperatures, and to thermally shield the mechanism from surroundings areas of higher temperature. Moreover, the retraction mechanism must operate in a vacuum environment, excluding the ambient or surrounding air until after the thermal joints are broken to preclude a sudden temperature surge which could upset the thermal balance of the superconducting magnet sufficient to quench the magnet and cause a sudden discontinuance of superconducting operation. That is, it is important that the retraction mechanism enable continued superconducting operation of the magnet during removal of the cryocooler from the magnet assembly.

In addition, there are a number of other generic problems encountered in the operation of superconducting magnets at superconducting temperatures, including problems of differential thermal expansion and contraction of materials, of minimizing cost, and of handling the forces generated by the significant magnetic fields required. All of these overlapping, and at times conflicting, requirements must be satisfied for a practical and satisfactory MRI superconducting magnet structure.

OBJECTS AND SUMMARY OF INVENTION

It is an object of the present invention to provide an improved thermally efficient retraction mechanism for cryogenic thermal joints.

It is another object of the present invention to provide a retraction mechanism for cryogenic joints which is positive and operable in the presence of sticking joints.

It is still another object of the present invention to provide an improved retraction mechanism for cryogenic joints which minimizes thermal leakage and contact resistance, and which enables the breaking of the joints while thermally shielded from the surrounding atmosphere.

It is yet another object of the present invention to provide a retraction mechanism for cryogenic joints utilizing an uncomplex mechanism to supplement the force transmitted by a compressed flexible bellows to accomplish the joint separation and retraction.

In accordance with one form of the present invention a positive retraction mechanism is provided for cryogenic thermal joints in a magnetic resonance imaging magnet assembly including an enclosed vessel which is cooled to superconducting temperatures. A cryocooler is detachably connected to the vessel through the thermal joint which includes a compressed deformable indium layer which is compressed to form the thermal joint.

The cryocooler retraction mechanism includes a compressed bellows and retraction screws cooperating with, but separated through clearance holes from, a retraction flange during operative connection of the cryocooler. During removal of the cryocooler the retraction flange is moved into engagement with the screws and applies positive pressure to separate the cryocooler from the vessel and break the thermal joint.

A compressed bellows positioned around the cryocooler assists in providing the separating force and an actuator sleeve around the assembly and connected to the flange at its end adjacent the enclosed vessel is provided to enable the retraction flange to move into engagement with the retraction screws.

DETAILED DESCRIPTION OF PREFERRED EMBODIMENT OF INVENTION

Figure 1:
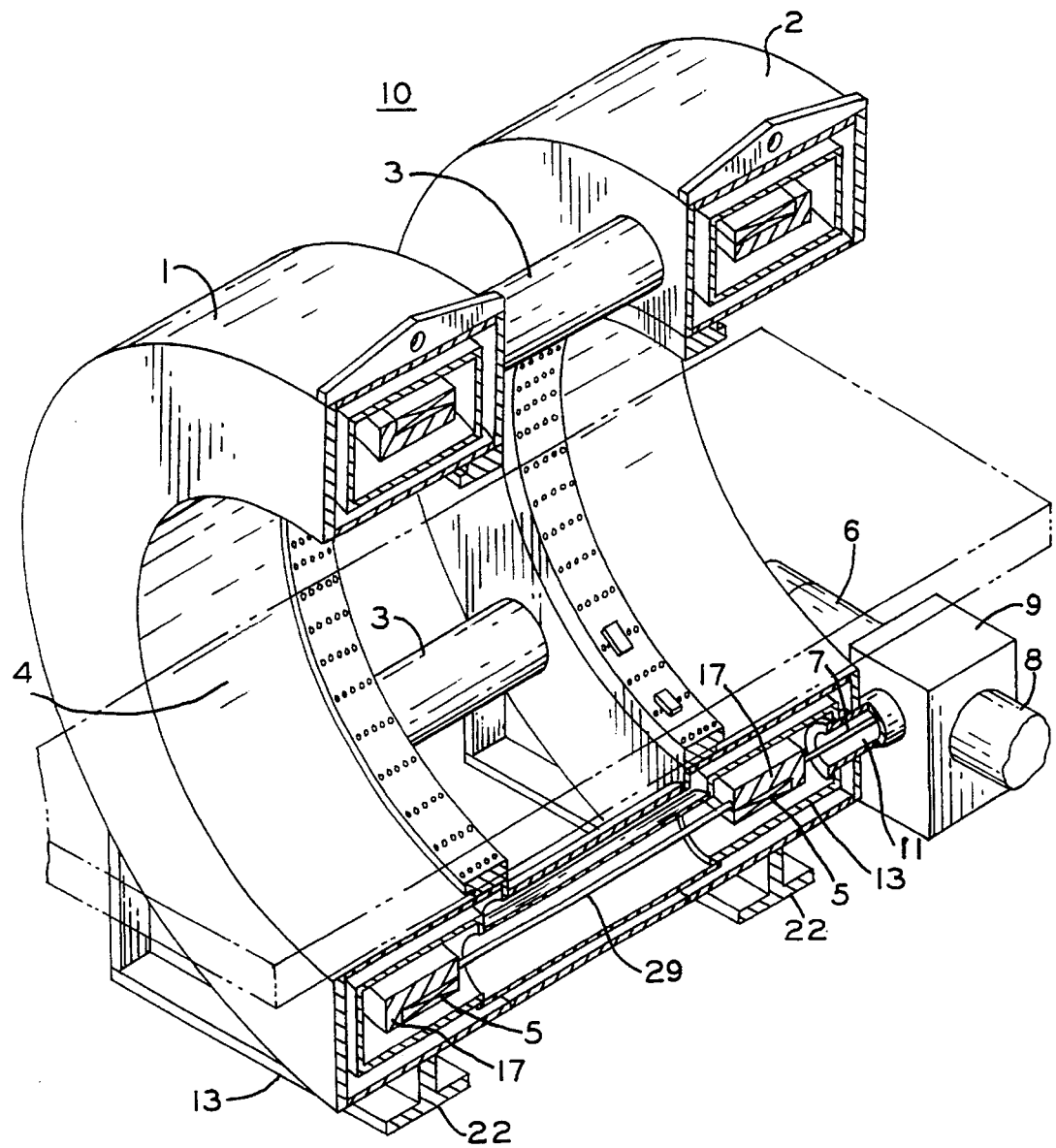
FIG. 1 shows a superconducting magnet assembly incorporating the present invention.
Figure 2:
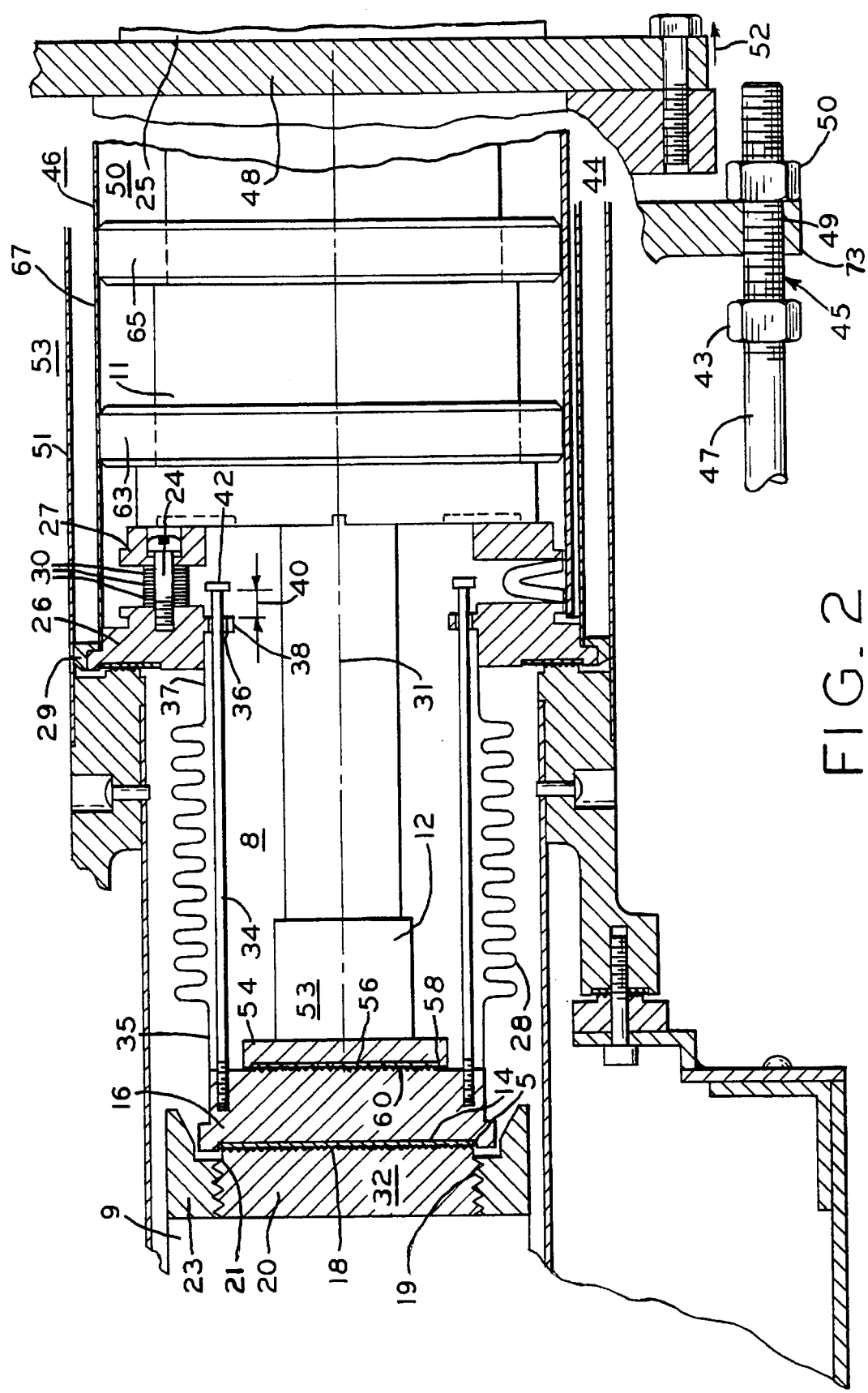
FIG. 2 is a cross section of a portion of FIG. 1.

Referring to FIGS. 1 and 2, superconducting magnet assembly 10 includes a pair of torroidal shaped stainless steel housings or cryostats 1 and 2 separated by three or four axially extending steel spacers such as 3 positioned some 90 degrees apart around the axis of substantially cylindrical central patient bore 4.

Cryocoolers 6 and 8 secured to base 22 provide cryogenic temperatures to superconducting magnet coils 5 within housings 1 and 2 through cooling manifold 9. Cryocoolers 6 and 8 are Gifford-McMahon 2 stage cryocoolers utilizing the present invention to provide thermal joints between cryocooler second stages 12 and cooling manifold assembly 9.

Figure 3:
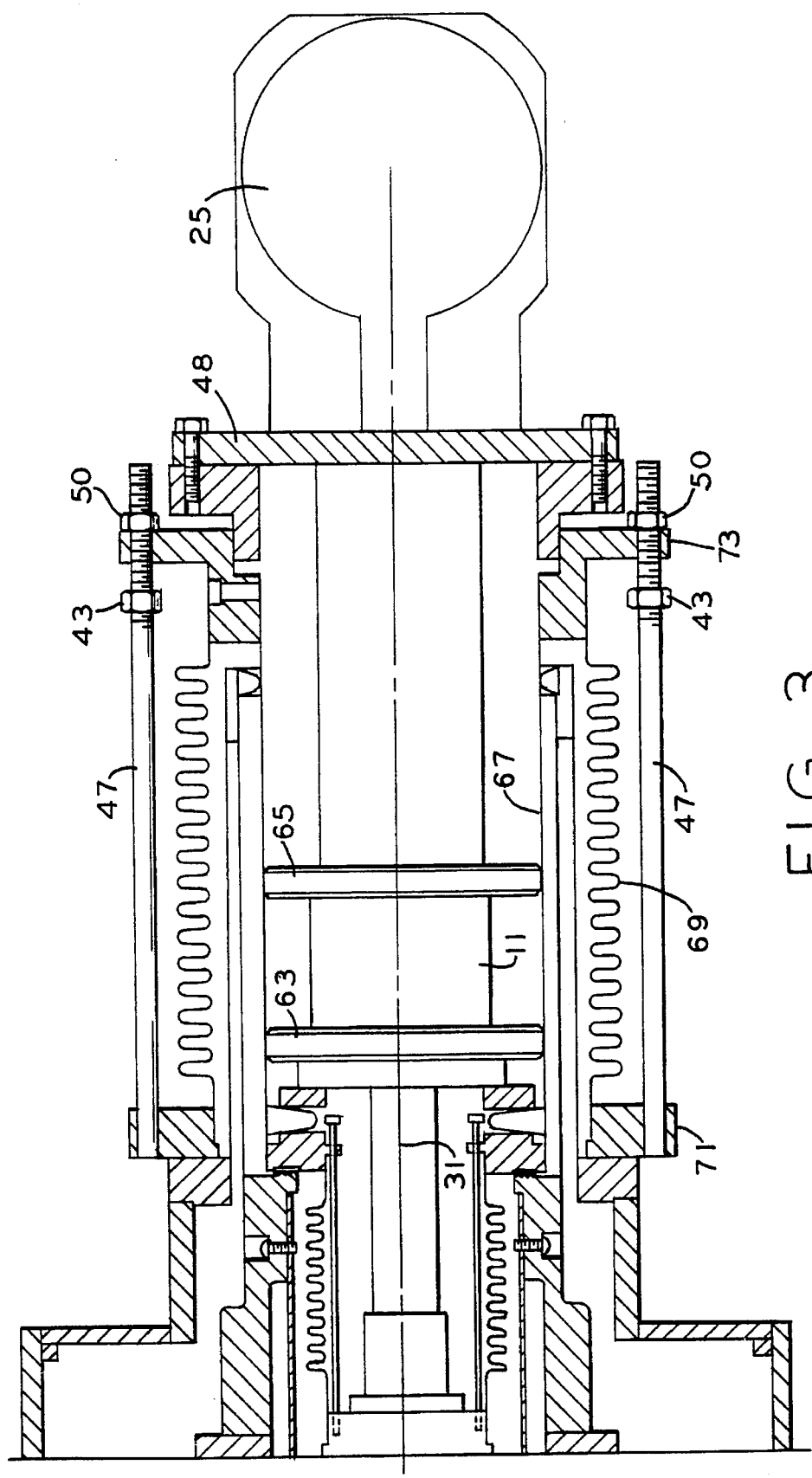
FIG. 3 is a cross section of a larger portion of FIG. 1 than that shown in FIG. 2.

Referring next to FIGS. 2 and 3, cryocooler 8 includes first stage 11 and second stage 12. Motor 25 drives cryocooler 8 to provide a temperature of 40K (degrees Kelvin) from first stage 11 for cooling thermal shields 13 within housings 1 and 2, and a temperature of 10K from second stage 12 to render magnet coils 5 superconducting. Indium layer 14 is metallurgically bonded to the mating or interface surface of heat sink 16 within pocket 5. Knurled mating or contact surface 18 of copper heat sink 20 includes raised members in a knurl or spiral pattern which dig into soft indium layer 14 to establish a very good thermal contact and establish thermal joint 32.

Cylindrical bellows 28 encircling second stage 12 of cryocooler 8 is compressed between retraction flange 26 and heat sink 16 when cryocooler 8 is secured in position and thermally joined to cooling manifold 9. Manifold 9 is connected through inlet 11 to the interior of housings 1 and 2 to cool coils 5 to superconducting temperatures.

Shoulder-screws 24 spaced circumferentially around retraction flange 26 guide a plurality of Belleville washers 30 which surround a turned down non-threaded portion of the shoulder screws, and which are cup-shaped to behave like springs providing a resiliency and compressed spring-like force against retaining ring 27.

Thermal joint 32 is formed by forcing thermal member 16 toward knurled mating surface 18 of copper heat sink 20 to compress and penetrate indium layer 14 in pocket 5. Thermal joint 32 is a very good joint with the thermal loss contact resistance minimized. It is to be noted that the temperature (of 10K) at thermal joint 32 is at a very large temperature differential from the temperature around the remote end of first stage 11 of cryocooler 8. There is a long thermal path created by bellows 28 to minimize thermal leakage. Teflon funnel-shaped bumper 23 is secured in position by internal threads 21 cooperating with external threads 19 on copper heat sink 20. Thermal link 7 connects the 10K second stage 12 of cryocooler 8 to the superconducting magnet assembly 17 including superconducting magnet coil 5. Teflon bumper 23 supports one end of the thin skinned bellows 28 to prevent drooping of the bellows and promote mechanical alignment of the assembly. A second thermal link 29 connects to the second superconducting magnet assembly 17 within housing 1. Retraction screws 34 (described below) are positioned within bellows 28.

Thermal joint 53 between cold head 54 of second stage 12 of cryocooler 8 and connecting thermal member 16 also includes a compressed indium layer 56 similar to indium layer 14. Indium layer 56 is contained within pocket 58 of cold head 54 positioned on one side of thermal joint 53 and the knurled surface 60 on the adjacent surface of connecting thermal member 16, forming thermal joint 53 similar to thermal joint 32. Teflon guide rings 63 and 65 assist in centering cryocooler 8 within tube 67. Outer bellows 69 extends between flanges 71 and 73.

After a period of time thermal joints 32 and 53 become stuck or "cold welded" such that it becomes difficult to remove cryocooler 8 and sleeve for service, maintenance or replacement. A large force is necessary to break the welds. The thermal joints are broken to avoid upsetting the thermal balance within housings 1 and 2. The extension force of compressed bellows 28 has proven inadequate to properly accomplish the thermal break. Bellows 28 is necessarily relatively thin, in order to minimize heat leakage. An adequate separating or extension force required for the bellows to break thermal joint 32 without assistance would require stiff and thick walls for bellows 28 which would result in unacceptable heat leakage. Bellows 28 is brazed at end 35 to connecting thermal member 16 and at the opposite end to retraction flange 26.

3 to 6 long retraction screws such as 34 are spaced around axis 31 of cryocooler 8 and secured by threads or welding at their inner ends to connecting thermal member 16. The remote ends of retraction screws 34 pass through clearance holes 36 in retraction ring or flange 38 depending from, and part of, retraction flange 26. Retraction screws or rods 34 are 5 inches long and are made of stainless steel to minimize heat leakage between retraction flange 26 and thermal joint 32 which are at substantially different temperatures of 40K and 10K.

The distance between retraction ring 38 and head 42 of retraction screw 34 indicated by arrows 40 is 0.25 inches. Retraction screws 34 thus do not contact retraction flange 26 during normal operation of cryocooler 8 and maintenance of thermal joint 32.

Surrounding the end of cryocooler 8 remote from thermal joint 32 is retraction or mobile sleeve assembly 44 which in addition to bellows 28 and retraction flange 26 includes thin tubular extension 67 and end plate 73 surrounding first stage 11 and motor 25 of the cryocooler within a vacuum tight enclosure. Sleeve 46 is brazed to retraction flange 26 and retraction end flange 73 at the other end. Bumper 29 is positioned between retraction flange 26 and outer sleeve 51 and is fabricated of an insulting material such as a fiber glass composite or Teflon and guides and facilitates axial or sliding motion of mobile sleeve assembly 46 within the outer sleeve which is interposed between mobile sleeve 46 and surrounding air 53.

Equally spaced around the circumference of end flange 73 are 3 or more tie rods such as 47 each of which includes threaded portion 45 passing through clearance hole 49. Screws 47 are fixed by being secured by way of anchors 71 to base 22. Nuts 43 on the side of end flange 73 closest to thermal joints 32 and 53 on fixed threads 45 can be driven into contact with end flange 73 to drive it to the right in FIG. 2 as indicated by arrow 52.

When there is a need to remove cryocooler 8 from superconducting magnet 10 for service or replacement end flange 73 is driven in the direction of arrow 52, and away from heat sink 20 of magnet 10 by rotation of nuts or jacking screws 43 moving retraction flange 26 through movement of connecting sleeve 46 0.25 inches or more into contact with heads 42 of retraction screws 34. This movement is assisted by the extension force of bellows 28.

Once tubular extension 67 has moved retraction flange 26 into contact with heads 42 of screws 34, further rotation or turning of nuts 43 provides positive controllable movement to the right of retraction flange 26 which through retraction rods 34 provides a uniform force to break thermal joint 32 for second stage 12 of the cryocooler. This is accomplished without upsetting the thermal balance within housings 1 and 2 of superconducting magnet 10 since cryocooler 8 is separated from the hot surrounding air 53 by bellows 69, flange 73, tubular extension 67, flange 26, bellows 28 and end piece 16. The movement of remote retraction end plate or actuator 73 thus moves retraction flange 26 into operative contact with retraction screws 34 which in turn enables positive axial movement of retraction flange 26 with cryocooler 8 "in tow" to break thermal joint 32. After thermal joint 32 is broken, cryocooler 8 may be removed for replacement and/or repair.

It is to be noted that the invention minimizes thermal loss by lack of direct thermal contact during normal operation of the thermal joint, being brought into contact only during the thermal joint breaking operation which is accomplished without breaking the vacuum within the surrounding mobile sleeve assembly 55. The thermal loss and hence loading on cryocooler 8 is minimized by the design enabling the superconducting operation of superconducting magnet 10 through use of conduction cooling by cryocoolers 6 and 8. This helps avoid the use of liquid helium cooling and facilitates an open architecture superconducting magnet design, even with its increased problems of cooling to superconducting temperatures over a more conventional single cylinder magnet. Also, sequential incremental rotation of the plurality of nuts 43 on jacking screws 47 enables a controlled pressure on, and movement of, cryocooler 8 through retraction flange 26 to break thermal joint 32.

While the present invention has been described with respect to certain preferred embodiments thereof, it is to be understood that numerous variations in the details of construction, the arrangement and combination of parts, and the types of materials used may be made without departing from the spirit and scope of the invention.

What I claim is:

1. A positive retraction mechanism for a magnetic resonance imaging magnet assembly cryogenic thermal joints comprising:

a superconducting magnet assembly including an enclosed vessel with means to cool the assembly to superconducting temperatures;

a device detachably connected to said magnet through at least one thermal joint;

said thermal joint including a soft material positioned between said magnet and said device;

means to detachably secure said device to said magnet which compresses said soft material and provides said thermal joint;

a retracting mechanism for separating said device from said magnet including at least one retraction screw secured to said device and a retraction flange;

said at least one retraction screw being separated from, and out of contact with, said retraction flange during the operation of said thermal joint; and actuating means to move said retraction flange and said retraction screws into contact to apply pressure to said device to separate said device from said magnet and break said thermal joint.

2. The positive retraction mechanism for a cryogenic thermal joint of claim 1 wherein said flange includes clearance holes to prevent contact of said retraction screws with said flange while said mechanism is in said operating position.

3. The positive retraction mechanism for a cryogenic thermal joint of claim 2 wherein said actuating means includes a sleeve and a plurality of moveable members separated angularly about the axis of said device to move said sleeve to move said flange into contact with said retraction screws.

4. The positive retraction mechanism for a cryogenic thermal joint of claim 3 wherein said actuating means further includes members threaded on portions of fixed screws to contact and move said sleeve upon actuation of said members.

5. The positive retraction mechanism for a cryogenic thermal joint of claim 4 wherein said members are nuts and rotation of said nuts applies controllable pressure to said device through said flange and retraction screws to move said device away from said thermal joint.

6. The positive retraction mechanism for a cryogenic thermal joint of claim 3 wherein said retraction screws and said flange are stainless steel.

7. The positive retraction mechanism for a cryogenic thermal joint of claim 6 wherein said soft material is indium and at least one surface between said flange and said vessel includes projections.

8. The positive retraction mechanism for a cryogenic thermal joint of claim 7 where said surface is a copper surface on said vessel.

9. The positive retraction mechanism for a cryogenic thermal joint of claim 8 wherein said indium is approximately 0.06 inches thick.

10. The positive retraction mechanism for a cryogenic thermal joint of claim 9 wherein said indium is deformed by said knurled surface when said cryogenic joint is in said operating position.

11. The positive retraction mechanism for a cryogenic thermal joint of claim 10 wherein means are provided to prevent drooping of said bellows and to promote mechanical alignment.

12. The positive retraction mechanism for a cryogenic thermal joint of claim 1 including a bellows positioned around at least a portion of said device and between the region around said thermal joint and said retraction flange, with said bellows being compressed during maintenance of said thermal joint.

13. The positive retraction mechanism for a cryogenic thermal joint of claim 12 wherein said bellows imparts a separating force to assist in separating said thermal joint for removal of said device from said magnet assembly.

14. The positive retraction mechanism for a cryogenic thermal joint of claim 13 wherein said device is a cryocooler.

15. A positive retraction mechanism for magnetic resonance imaging magnet assembly cryogenic thermal joints comprising:

a superconducting magnet assembly including an enclosed vessel with a conduction cooled cryocooler to cool said magnet assembly to superconducting temperatures;

said cryocooler detachably connected to said magnet through a thermal joint to enable the selective removal of said cryocooler;

said thermal joint including a sort material positioned between said vessel and said device:

means to detachably secure said cryocooler to said vessel which compresses said soft material and provides said thermal joint;

a retracting assembly for separating said cryocooler from said vessel including at least one retraction member and a cooperating retraction flange;

said at least one retraction member being separated from, and out of contact with, said retraction flange during the operation of said thermal joint;

said retraction flange being moveable into contact with said at least one retraction member; and actuating means to move said retraction flange and said cryocooler to apply pressure to said thermal joint to separate said cryocooler from said magnet and break said thermal joint;

said retraction assembly further including means to thermally shield said cryocooler from the surrounding air during the breaking of said thermal joint.

16. The positive retraction mechanism for a thermal joint for a cryocooler of claim 15 wherein said flange includes clearance holes to prevent contact of said retraction member with said flange while said thermal joint is in the operating position.

17. The positive retraction mechanism for a thermal joint for a cryocooler of claim 16 wherein said actuating means includes a sleeve and an end plate enclosing said cryocooler, and said sleeve being connected to said flange to move said flange into contact with said retraction members upon movement of said end plate.

18. The positive retraction mechanism for a thermal joint for a cryocooler of claim 17 wherein nuts rotatable on fixed screws passing through said end plate are provided to drive said end plate away from said thermal joint upon rotation of said nuts to move said cryocooler away from said thermal joint to break said thermal joint.

19. The positive retraction mechanism for a thermal joint for a cryocooler of claim 18 wherein a compressed bellows positioned between said flange and the region proximate to said joint and surrounding at least a portion of said cryocooler imparts force to assist in moving said retraction flange into contact with said at least one retraction member.

* * * * *